(12) United States Patent
Wong et al.

(10) Patent No.: US 6,469,394 B1
(45) Date of Patent: Oct. 22, 2002

(54) CONDUCTIVE INTERCONNECT STRUCTURES AND METHODS FOR FORMING CONDUCTIVE INTERCONNECT STRUCTURES

(75) Inventors: Connie M. Wong, Fremont; Michael G. Lee, San Jose, both of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/494,756

(22) Filed: Jan. 31, 2000

(51) Int. Cl.⁷ .............................................. H01L 23/48
(52) U.S. Cl. ...................... 257/780; 257/778; 257/789; 438/108; 438/612
(58) Field of Search ................................ 257/778, 779, 257/780, 738; 438/108, 612, 614, 613

(56) References Cited

U.S. PATENT DOCUMENTS

| | | | |
|---|---|---|---|
| 4,045,312 A | 8/1977 | Satoshi ................... 204/129.65 |
| 4,067,104 A | 1/1978 | Tracy ........................... 29/626 |
| 4,376,505 A | 3/1983 | Wojcik ....................... 228/215 |
| 4,418,857 A | 12/1983 | Ainslie et al. ............... 228/124 |
| 4,835,344 A | 5/1989 | Iyogi et al. ................. 174/68.5 |
| 4,878,294 A | 11/1989 | Dugan et al. .................. 29/852 |
| 4,921,157 A | 5/1990 | Dishon et al. ............... 228/124 |
| 4,955,523 A | 9/1990 | Calomagno et al. ........ 228/179 |
| 5,014,111 A | 5/1991 | Tsuda et al. ................... 357/68 |
| 5,027,062 A | 6/1991 | Dugan et al. ................ 324/158 |
| 5,054,192 A | 10/1991 | Cray et al. .................... 29/835 |
| 5,057,453 A * | 10/1991 | Endo et al. .................. 437/183 |
| 5,074,947 A | 12/1991 | Estes et al. ............... 156/307.3 |
| 5,075,965 A | 12/1991 | Carey et al. ................... 29/840 |
| 5,092,036 A | 3/1992 | Hu et al. ....................... 29/854 |
| 5,164,818 A | 11/1992 | Blum et al. .................. 257/778 |
| 5,299,729 A | 4/1994 | Matsushita et al. .... 228/180.22 |
| 5,334,804 A | 8/1994 | Love et al. .................. 174/267 |
| 5,376,585 A | 12/1994 | Lin et al. ..................... 437/192 |
| 5,447,871 A | 9/1995 | Goldstein ..................... 437/14 |
| 5,448,016 A | 9/1995 | DiPaolo et al. ........... 174/126.1 |
| 5,466,635 A | 11/1995 | Lynch et al. ................. 437/183 |
| 5,483,741 A | 1/1996 | Akram et al. .................. 29/846 |
| 5,506,514 A | 4/1996 | Difrancesco ................. 324/757 |
| 5,508,561 A | 4/1996 | Tago et al. ................... 257/737 |
| 5,527,734 A | 6/1996 | van der Putten ............ 437/183 |
| 5,531,021 A | 7/1996 | Kolman et al. ................ 29/843 |
| 5,541,135 A | 7/1996 | Pfeifer et al. .................. 437/60 |
| 5,545,589 A | 8/1996 | Tomura et al. .............. 437/183 |
| 5,558,271 A | 9/1996 | Rostoker et al. ........ 228/180.22 |
| 5,559,054 A | 9/1996 | Adamjee ..................... 437/183 |
| 5,579,573 A | 12/1996 | Baker et al. ................... 29/840 |
| 5,607,877 A | 3/1997 | Matsuda et al. ............. 437/180 |
| 5,611,481 A | 3/1997 | Akamatsu et al. ...... 228/180.22 |
| 5,620,129 A | 4/1997 | Rogren ........................ 228/56.3 |
| 5,633,204 A | 5/1997 | Tago et al. ................... 438/614 |
| 5,640,052 A | 6/1997 | Tsukamoto .................. 257/781 |
| 5,667,132 A | 9/1997 | Chirovsky et al. ...... 228/180.22 |
| 5,668,410 A | 9/1997 | Yamamoto ................... 257/737 |
| 5,672,260 A * | 9/1997 | Carey et al. ................. 205/118 |
| 5,722,162 A | 3/1998 | Chou et al. .................... 29/852 |
| 5,737,833 A | 4/1998 | Motomura et al. ........... 29/830 |
| 5,743,006 A | 4/1998 | Beratan ......................... 29/840 |
| 5,746,903 A | 5/1998 | Beilin et al. ................. 205/118 |
| 5,889,326 A * | 3/1999 | Tanaka ......................... 257/737 |
| 6,198,169 B1 * | 3/2000 | Kobayashi et al. .......... 257/780 |

FOREIGN PATENT DOCUMENTS

EP      0-327-399 A1     3/1989 ........... H01L/23/50

\* cited by examiner

*Primary Examiner*—Steven Loke
*Assistant Examiner*—Donghee Kang
(74) *Attorney, Agent, or Firm*—Coudert Brothers LLP

(57) ABSTRACT

Interconnect structures and methods for making interconnect structures are disclosed. A typical interconnect structure has a tapered first end portion having a first substantially planar surface and a concave surface adjacent to the first planar surface. A second end portion of the interconnect structure includes a second substantially planar surface. The second planar surface has a larger area than the first planar surface. An intermediate portion is disposed between the first end portion and the second end portion.

16 Claims, 6 Drawing Sheets

CONDUCTIVE INTERCONNECT STRUCTURES AND METHODS FOR FORMING CONDUCTIVE INTERCONNECT STRUCTURES

FIELD OF THE INVENTION

Embodiments of the invention relate to conductive interconnect structures and methods for forming conductive interconnect structures.

BACKGROUND OF THE INVENTION

In electrical assemblies such as multichip modules, integrated circuit chips are electrically coupled to a circuit substrate through one or more interconnect structures. These interconnect structures provide electrical pathways between the chip and the circuit substrate. For example, interconnect structures such as conductive posts can be disposed between a chip and a circuit substrate to electrically communicate the chip and the substrate.

If plural interconnect structures are disposed between a chip and a circuit substrate, at least one end of each interconnect structure is soldered to the chip or the circuit substrate. The steps used in a typical soldering process include fluxing, reflowing, and post-solder cleaning. After solder paste is applied to the surfaces to be joined, a flux in the solder paste removes metal oxides (fluxes) from the solder particles in the solder paste and from the surfaces to be soldered. Removing oxides is desirable, because metal oxides typically increase the resistance of the formed solder joint and decrease the wettability of the solder. During reflow, the solder paste is heated and the solder particles coalesce into a cohesive solder body. The solder body joins the surfaces to be soldered so that they are in electrical communication with each other. After reflow, flux residue generated during the fluxing step is removed in the post-solder cleaning step. In a typical post-solder cleaning step, a solvent is applied to the solder joint to remove flux residue from the solder joint.

Fluxing has generally been effective to form interconnections between a chip and a circuit substrate. However, fluxing increases the number of steps used in the interconnection process. This consequently increases the cost of producing the intended product. Moreover, many solvents used in the post-solder cleaning step, are not environmentally friendly. In view of these problems, it would be desirable to provide for interconnect structures which can potentially decrease or eliminate fluxing steps in an interconnection process.

SUMMARY OF THE INVENTION

Embodiments of the invention are directed to interconnect structures and methods of making and using interconnect structures.

One embodiment of the invention is directed to a conductive post comprising: a tapered first end portion having a first substantially planar surface and a concave surface adjacent to the first planar surface, a second end portion including a second substantially planar surface, wherein the second planar surface has a larger area than the first planar surface; and an intermediate portion disposed between the first end portion and the second end portion.

Another embodiment of the invention is directed to a method for forming a conductive interconnect structure, the method comprising: forming a conductive body on a conductive region, wherein a first end portion of the conductive body is disposed distal to the conductive region and a second end portion of the conductive body is disposed proximate the conductive region; and removing conductive material from the first end portion of the conductive body such that the first end portion is tapered.

Another embodiment of the invention is directed a method comprising forming an electrically conductive article comprising a dielectric layer, a conductive region on the dielectric layer, and a conductive post on the conductive region, wherein a tapered first end portion, of the conductive post is distal to the conductive region, and a second end portion of the conductive post is proximate to the conductive region; and inserting at least a portion of the tapered first end portion into a solder body, wherein the tapered first end portion is in electrical communication with an interior region of the solder body.

These and other embodiments of the invention are described in further detail below.

DETAILED DESCRIPTION

Figure 1A:
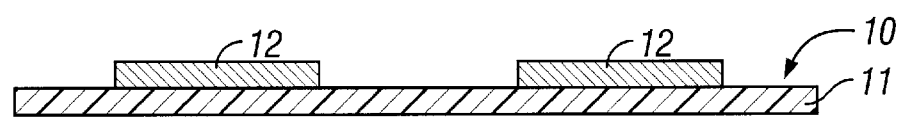
FIGS. 1(a)–1(d) show cross-sections of structures formed during the formation of conductive bodies.

One embodiment of the invention is directed to a method for forming an interconnect structure such as a conductive post. The method includes forming a conductive body on a conductive region. A first end portion of the formed conductive body is disposed distal to the conductive region and a second end portion at the opposite end of the conductive body is disposed proximate to the conductive region. The conductive body is preferably elongated so that a conductive post can be formed from it. After the conductive body is formed, conductive material is removed from the first end portion of the conductive body so that the first end portion is tapered. The resulting structure is an interconnect structure having a tapered first end portion. The formed interconnect structure can be a pad, line, or post having a tapered portion. Preferably, the interconnect structure is a conductive post having. a tapered portion.

The interconnect structure embodiments can be used to electrically couple a chip and a circuitized layer together without fluxing. For example, with reference to FIG. 6, a circuitized layer 10 including an insulating layer 11 and a conductive region 12 is electrically coupled to an electrical device 81 (e.g., a chip) using an interconnect structure 65 disposed on the circuitized layer 10. The electrical device 81 has a conductive pad 82, and a solder body 91 is disposed on the conductive pad 82. The solder body 91 can be a solder ball, which has been previously reflowed. A native oxide layer (not shown) is typically present at the surface of the reflowed solder body 91.

When coupling the electrical device 81 to the circuitized layer 10, the solder body 91 can be aligned with the tapered first end portion 65(a) of the interconnect structure 65.

Downward pressure on the solder body 91 and/or upward pressure on the interconnect structure 65 causes the tapered first end portion 65(a) to penetrate through the outer oxide layer on the solder body 91 and into the interior region of the solder body 91. Prior to insertion into the solder body 91, the first end portion 65(a) is preferably cleaned of any surface oxides. Alternatively or additionally, the first end portion 65(a) can include a substantially non-oxidizable metal such as a gold alloy. Advantageously, by forming interconnections this manner, the tapered first end portion 65(a) of the interconnect structure 65 is introduced to fresh, substantially uncontaminated, non-oxidized solder in the interior region of the solder body 91, thus permitting favorable electrical and mechanical contact to occur between the interconnect structure 65 and the solder body 91.

The favorable electrical and mechanical contact is aided by the high surface area at the first end portion 65(a). The high surface area at the first end portion 65(a) increases the contact area between the solder body 91 and the interconnect structure 65. Increasing the contact area improves the electrical and mechanical connection between the solder body 91 and the interconnect structure 65. The increased surface area of the first end portion 65(a) is due, in part, to the presence of the concave surface 65(d) at the first end portion 65(a).

Figure 6:
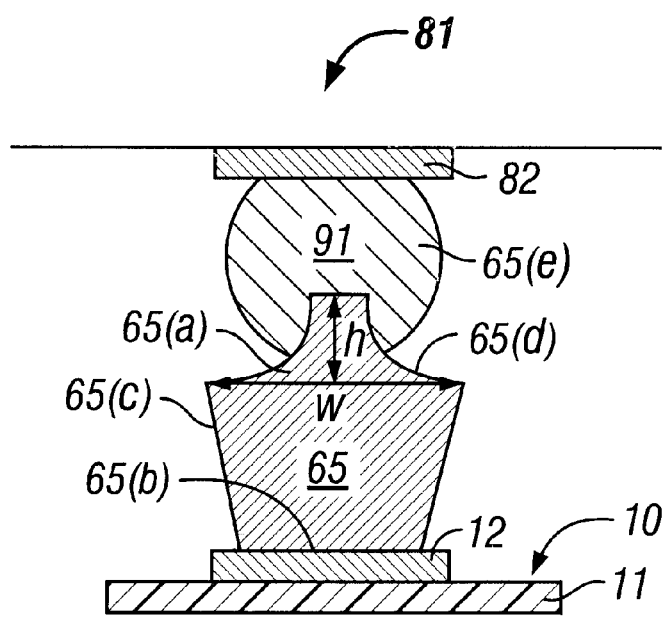
FIG. 6 shows a cross-section of an electrical assembly with a tapered end portion of an interconnect structure inserted into a solder body.

In addition to the tapered first end portion 65(a), the interconnect structure has a second end portion 65(b) and an intermediate portion 65(c) disposed between the first and second end portions 65(a), 65(b). The second end portion 65(b) and the intermediate portion 65(c) can have substantially the same cross-sectional area along the axial length of these portions. Also, as shown in FIG. 6, the cross-sectional area of the interconnect structure 65 may increase in an axial direction from the second end portion 65(b) to the intermediate portion 65(c) of the interconnect structure 65.

The sides of the first end portion 65(a) preferably have a concave surface 65(d). The concave surface 65(d) can at least partially define a substantially planar surface 65(e) at the first end portion 65(a), and may also be disposed around (e.g., surrounds) the substantially planar surface 65(e). The concave surface 65(d) may be disposed between the intermediate portion 65(c) and the planar surface 65(e) at the first end portion 65(a). The planar surface 65(e) at the first end portion 65(a) can have a smaller area than the planar surface at the opposite end of the interconnect structure 65. Although in some embodiments, a substantially planar surface 65(e) is present at the first end portion 65(a), in other embodiments, the apex of the tapered first end portion 65(a) can be a point.

The tapered first end portion 65(a) can have any suitable dimensions. For example, the height, h, of the tapered portion is preferably between about 5 microns and 15 microns high, while the width (e.g., a diameter), w, at the base of the tapered portion is preferably between about 20 microns and about 40 microns wide. Preferably, the ratio of the height, h, to the width, w, of the, tapered portion is preferably at least 1:4, and more preferably between about 1:4 and about 3:8.

The interconnect structure embodiments are preferably conductive posts. Conductive posts can reduce the likelihood that the interconnection between a chip and a circuit substrate will fail. For example, chips generate a substantial amount of heat during operation. The heat causes the chips to expand when the chip is in operation. When the chips are not in operation, the chips cool down and contract. The repeated on/off cycling of a chip during its operating lifetime causes the chip to expand and contract many times. This generates shear stress which may cause some interconnect structures to break, and thus fail over time.

Conductive posts increase the distance between the chip and a circuit substrate upon which the chip is mounted. The increased distance permits the chip to move more freely with respect to the circuit substrate. Generally, the conductive posts have a height greater than about 40 microns, and even greater than about 1 mm in some instances. The diameter or width of a cross-section of a typical conductive post can be about 100 microns or less. Also, the conductive posts preferably have a high aspect ratio. In embodiments of the invention, the conductive posts can have an aspect ratio of at least about 2:1 (e.g., 4:1 or more), and preferably between about 2:1 and about 10:1.

In embodiments of the invention, a conductive body is first formed on a conductive region such as a conductive pad. Preferably, the formed conductive body is elongated and is oriented perpendicular to the conductive region. The conductive body can be formed so that a first end portion is distal to the conductive region, while a second end portion is proximate to the conductive region.

The conductive body can be formed by any suitable process. For example, the conductive body can be formed by any suitable subtractive process. In an exemplary subtractive process, a metal sheet (e.g., a copper sheet) having a thickness of 100 microns or more can be formed on or laminated to a dielectric layer having conductive regions. A negative or positive photoresist layer (e.g., 10 microns thick or more) can then be deposited on the metal sheet, irradiated, and developed. Subsequently, an etchant is used to etch portions of the metal sheet exposed through the developed photoresist layer to form conductive bodies on the conductive regions.

The conductive bodies can also be formed by any suitable additive process. Preferred additive processes for forming conductive bodies using a positive photosensitive material can be described with reference to FIGS. 1(a)–1(d).

FIG. 1(a) shows a circuitized substrate 10 including a dielectric layer 11 having one or more conductive regions 12 thereon. The dielectric layer 11 may be flexible or rigid, and can include any suitable material including reinforced or non-reinforced ceramic or polymeric materials such as polyimide. The conductive regions 12 can be pads or lines, and can be in the form of one or more distinct layers of conductive material. For example, each of the conductive regions 12 can be a single layer of metal (e.g., copper), or a composite layer having two or more metal layers (e.g., titanium/copper or chromium/copper layers). The conductive regions 12 on the dielectric layer 11 preferably have a pitch of about 250 microns or less (e.g., 200 microns or less), and each of the conductive regions 12 can have a length (e.g., a diameter) of about 150 microns or less (e.g., 100 microns or less). The dielectric layer 11 and the conductive regions 12 may have any suitable thickness including a thickness of about 15 microns or less.

Figure 1B:
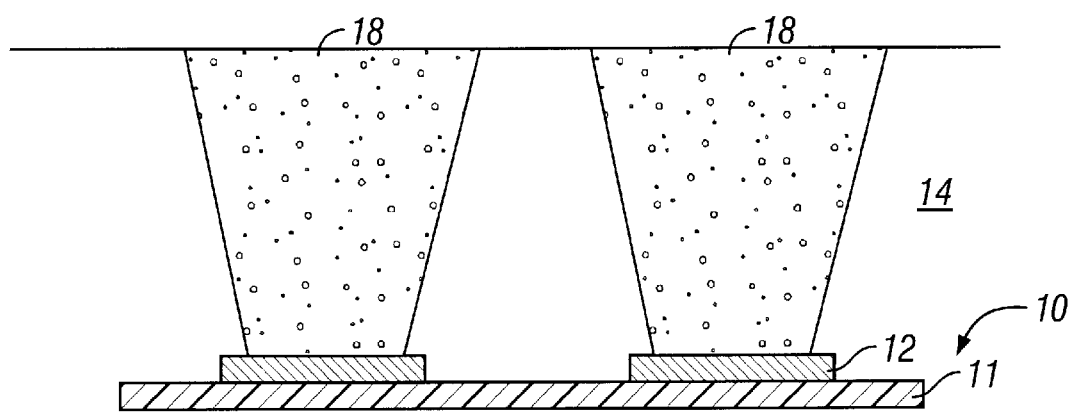
Figure 1C:
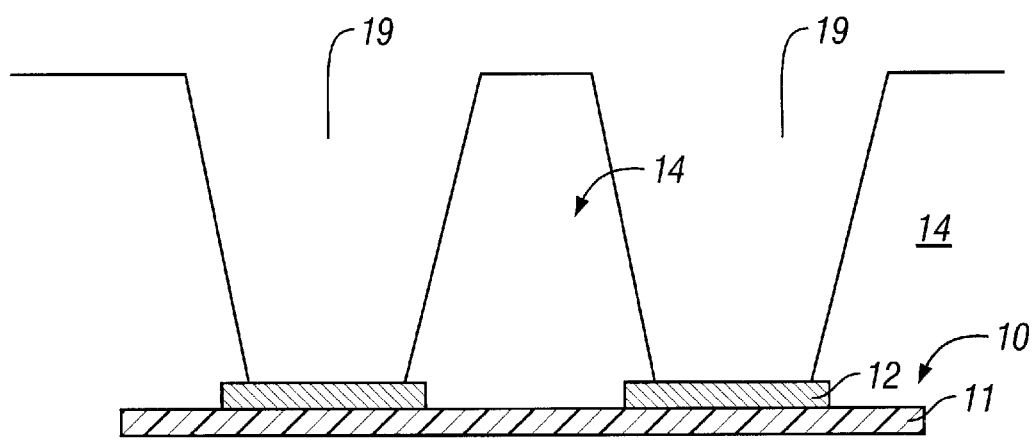

As shown in FIG. 1(b), a photosensitive layer 14 comprising a positive photosensitive material can be deposited on the circuitized substrate 10. After the photosensitive layer 14 is on the circuitized substrate 10, radiation is directed through a radiation mask (not shown) so that regions 18 disposed above the conductive regions 12 are irradiated. After irradiation, the irradiated regions 18 are rendered soluble in a developer solution, while the non-irradiated regions are generally not soluble in the developer solution. After contacting the photosensitive layer 14 with the developer solution, the irradiated regions 18 are removed, while the non-irradiated regions remain on the circuitized substrate 10. With reference to FIG. 1(c), plural apertures 19 are subsequently formed in the photosensitive layer 14. The formed apertures 19 are disposed above the conductive regions 12 of the circuitized layer 10.

After plural apertures 19 are formed in the photosensitive layer 14, a conductive material is deposited within the apertures 19. The conductive material can be deposited within the apertures 19 in any suitable manner. For example, a conductive material can be deposited into the apertures 19 by sputtering, stenciling or electroplating. Preferably, the conductive material is deposited within the apertures 19 by electroplating.

In a preferred electroplating process, the structure shown in FIG. 1(c), for example, can be immersed in an electroplating bath. In the electroplating bath, the conductive regions 12 can be used to initiate the plating of the desired conductive material from the conductive regions 12 towards the open ends of the apertures 19. For example, the conductive regions 12 may comprise copper. In a copper plating bath, the copper conductive regions 12 can be used to initiate copper plating from the conductive regions 12 towards the open ends of the apertures.

Figure 1D:
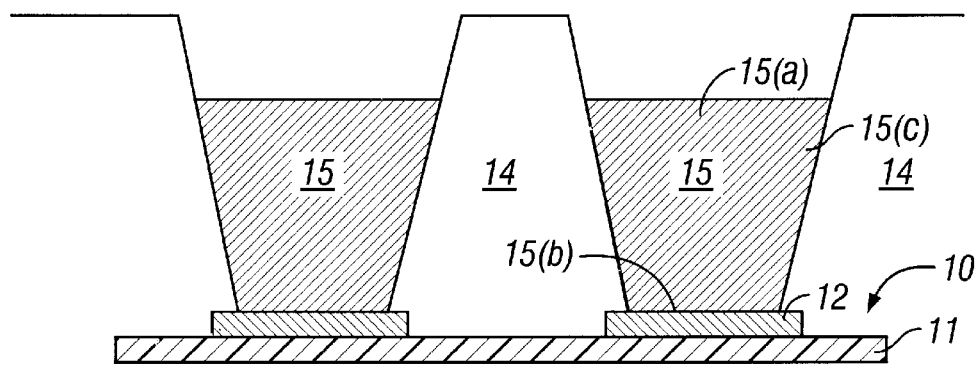

The deposition of the conductive material within apertures of the photosensitive layer is preferably terminated before the height of the forming conductive bodies exceeds the thickness of the photosensitive layer. With reference to FIG. 1(d), keeping the height of the conductive bodies 15 less than the thickness of the photosensitive layer 14 reduces the likelihood that conductive material will plate on the upper surface of the photosensitive layer 14. Consequently, the likelihood that a short-circuit (e.g., a dog-bone structure) will form between adjacent conductive bodies 15 is decreased.

After electroplating, the resulting conductive bodies 15 in the apertures are disposed perpendicular to the dielectric layer 11 and the conductive regions 12. Each conductive body 15 includes a first end portion 15(a), a second end portion 15(b), and an intermediate portion 15(c) disposed between the first and second end portions 15(a), 15(b). The second end portion 15(b) is disposed proximate to, and may be in contact with, the conductive region 12, while the first end portion 15(a) is distal to the conductive region 12. The first and second end portions 15(a), 15(b) can each have substantially planar surfaces at respective opposite ends of the conductive body. Prior to the removal of conductive material from the first end portion 15(a), the cross-sectional area of the first end portion 15(a), the second end portion 15(b), and the intermediate portion 15(c) along the axial length of the conductive body 15 can be substantially the same. Moreover, as shown in FIG. 1(d), the cross-sectional area of the conductive body 15 may gradually increase from the closed end of the aperture in the photosensitive layer to the open end of the aperture.

After a conductive body is formed, conductive material is removed from the first end portion of the conductive body. This reforms the first end portion of the conductive body into a tapered structure. Any suitable operation can be used to remove conductive material from the first end portion. For example, conductive material at the first end portion can be removed by an etching process such as an electrolytic or a chemical etching process.

In some embodiments of the invention, conductive material can be removed from the first end portion of the conductive body by electrolytic etching. In a typical electrolytic etching process, an electrolytic medium is disposed between a structure having conductive bodies (e.g., as shown in FIG. 1(d)) and a cathode element. The first end portions of the conductive bodies can constitute an anode, while conductive surfaces of the cathode element exposed to the conductive bodies can constitute a cathode. As current passes through the electrolytic medium, the metal atoms at the desired surfaces of the first end portion of each respective conductive body are oxidized to form metal ions. The oxidized metal atoms pass from the surface of the first end portion and into the electrolytic medium, thus removing conductive material from the first end portion of the conductive body. During electrolytic etching, metal ions in the electrolytic medium may be reduced and may plate out on the cathode element. While any suitable average current density, can be used to perform electrolytic etching, preferred average current densities can be at least about 5, and preferably at least about 10 mA/cm$^2$.

Figure 2A:
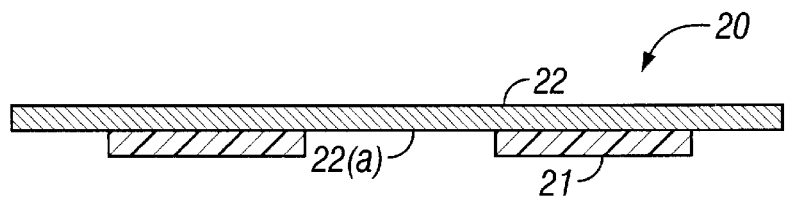
FIGS. 2(a)–2(b) show schematic cross-sections illustrating a process of fabricating a conductive body having a tapered end.
Figure 2A:
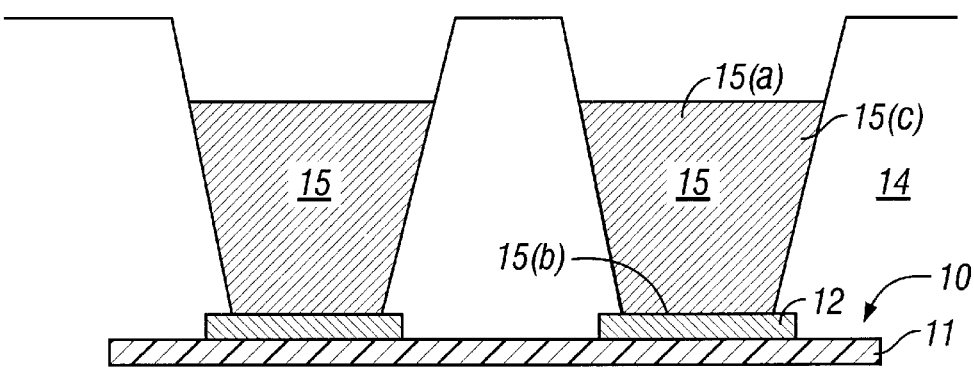
Figure 2B:
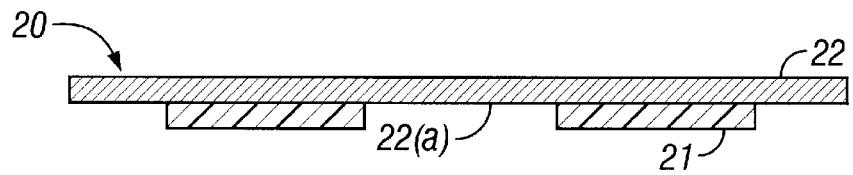
Figure 2B:
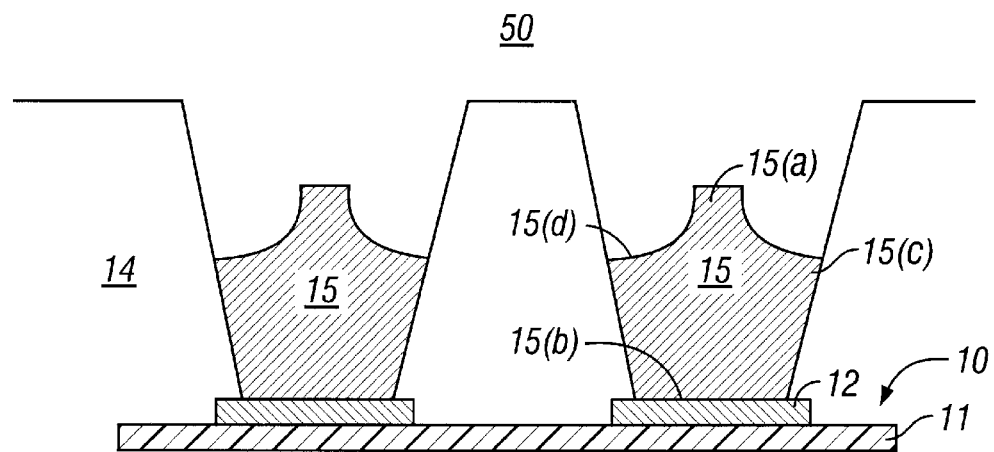

An electrolytic etching embodiment can be described with reference to FIGS. 2(a) and 2(b). In an exemplary electrolytic etching arrangement, a cathode element 20 can be generally planar and oriented generally parallel to the circuitized layer 10. The cathode element 20 and the conductive bodies 15 can be aligned with each other and spaced from each other. Preferably, the spacing between the cathode element 20 and the first end portions 15(a) of the conductive bodies 15 is about 10 mm or less.

The circuitized layer 10 includes a dielectric layer 11 and conductive regions 12. A developed photosensitive layer 14 with apertures is disposed on the circuitized substrate 10, and conductive bodies 15 are disposed within the apertures. The conductive bodies 15 are elongated and are oriented generally perpendicular to the conductive regions 12.

An electrolytic medium 50 is disposed-between the cathode element 20 and the conductive bodies 15. Any suitable electrolytic medium can be used. For example, the electrolytic medium 50 can be an acid-based electrolyte containing ions of the material to be removed from the conductive bodies. For example, the electrolytic medium 50 can comprise an acid (e.g., $H_2SO_4$) and metal ions (e.g., $Cu^+$, $Cu^{2+}$).

The cathode element 20 preferably has conductive portions 22(a) exposed to the first end portions 15(a) of the conductive bodies 15. For example, the cathode element 20 may include a conductive member 22. The conductive member 22 can be a continuous conductive sheet and can include any suitable conductive material. Suitable soluble conductive materials include metals such as copper and tin, while suitable insoluble conductive materials include metals such as platinum, titanium, and niobium. A discontinuous cover layer 21 is disposed on the conductive member 20, covering some portions and exposing others. The exposed conductive portions 22(a) of the cathode element 20 can receive ions from the electrolytic medium and can be plated with metal during electrolytic etching. Adjacent exposed conductive portions 22(a) can be separated by 10 microns or less.

The cover layer 21 may comprise a dielectric material. Suitable dielectric materials include polymeric materials such as Teflon™ (polytetrafluoroethylene). The cover layer 21 can be formed on the conductive member 22 by, e.g., stenciling or photolithography. Alternatively, the cover layer 21 can be in the form of a preformed sheet optionally mounted on a tension frame. The preformed sheet can have holes formed by punching or drilling. The preformed sheet is then placed adjacent to the conductive member 22, and is secured to the conductive member 22 with holding members (e.g., clamps). In other embodiments, the cover layer 21 may comprise one or more strips of plating tape such as masking tape.

The pattern of exposed conductive portions 22(a) is preferably the negative image of the pattern of conductive bodies to be etched. For instance, the cover layer 21 may have a pattern generally corresponding to the pattern of conductive bodies 15 on the dielectric layer 11. The pattern of exposed conductive portions 22(a) can be the negative image of both the cover layer 21 and the pattern conductive bodies 15. In other embodiments, the conductive member of the cathode element can be discontinuous. For example, cathode element may include an insulating layer having a discontinuous conductive pattern thereon. The discontinuous conductive pattern can be plated during electrolytic etching.

By providing a cathode element with a discontinuous conductive plating surface, the current density can be varied at different locations within the electrolytic medium so that predetermined areas of the first end portions can be etched more rapidly than other areas. For example, the regions of the electrolytic medium 50 closer to the exposed conductive member portions 22(a) have a greater current density than the regions of the electrolytic medium farther away from these exposed portions. Consequently, the surfaces of the first end portions 15(a) of the conductive bodies 15 which are closer to the exposed portions 22(a) of the conductive member 20 are etched faster than surfaces which are farther away. Thus, in embodiments of the invention, predetermined surfaces of the conductive bodies can be selectively etched. For example, as shown in FIG. 2(b), electrolytic etching removes conductive material from the sides of the first end portion 15(a) of the conductive body 15 faster than at the upper planar surface of the conductive body 15 so that a tapered structure is formed.

Figure 3A:
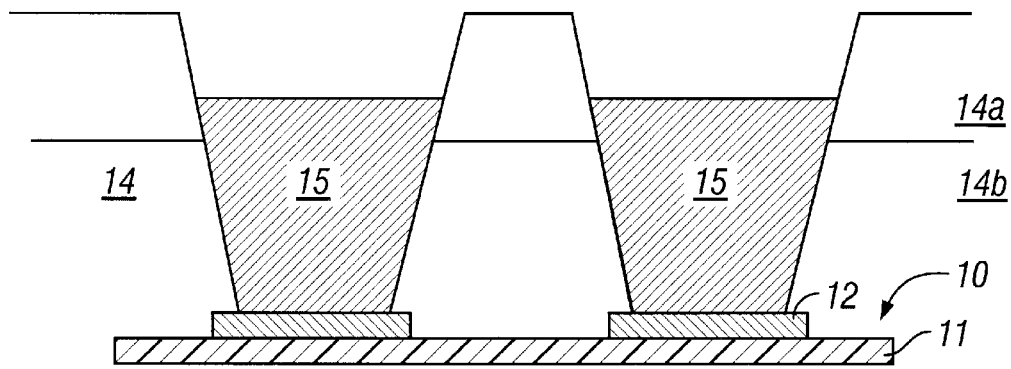
FIGS. 3(a)–3(b) show schematic cross-sections illustrating another process of fabricating a conductive body having a tapered end.

After a conductive body is formed, (e.g., after electroplating is completed) and prior to removing material from the first end portion, the photosensitive layer used to form the conductive body may be partially or fully removed, or may not be removed at all. For example, with reference to FIG. 3(a), an upper portion 14(a) of the photosensitive layer can be removed to expose side surfaces of the unreformed first end portions. This can be done by, for example, blank flood irradiating a positive photosensitive layer 14 at low energies and/or for a short period of time. Exemplary blank flood irradiation processes are described in U.S. Pat. No. 5,722,162 which is herein incorporated by reference and is assigned to the same assignee of the present application. After irradiation, an upper portion of the photosensitive layer 14 can be rendered more soluble in a developer solution than the lower portion. The upper portion can be subsequently developed in the developer solution, while the lower portion of the photosensitive layer can remain. Alternatively, the upper and lower portions 14(a), 14(b) of the photosensitive layer 14 can be made of two different materials with different properties. For example, an upper portion 14(a) may include a material which has a greater solubility than a lower portion 14(b) so that the upper portion 14(a) may be removed while not removing the lower portion 14(b).

In embodiments of the invention, the thickness of the photosensitive layer is reduced so that sides of the first end portion are exposed to an etching medium such as a chemical etchant or an electrolytic medium. After the thickness of the photosensitive layer is reduced, the height of the conductive bodies is preferably greater than the thickness of the photosensitive layer. The sides of the intermediate portions of the conductive bodies and the second end portions can be covered by the reduced-thickness photosensitive layer so that they are protected during etching. By doing so, etching can be generally confined to the first end portion of the conductive body. The amount of conductive material removed from the conductive bodies can be limited to those areas which are to be inserted into a solder body. Consequently, in embodiments of the invention, the etching of the conductive material can be minimized and the amount of conductive material in the resulting interconnect structure can be maximized.

Figure 3B:
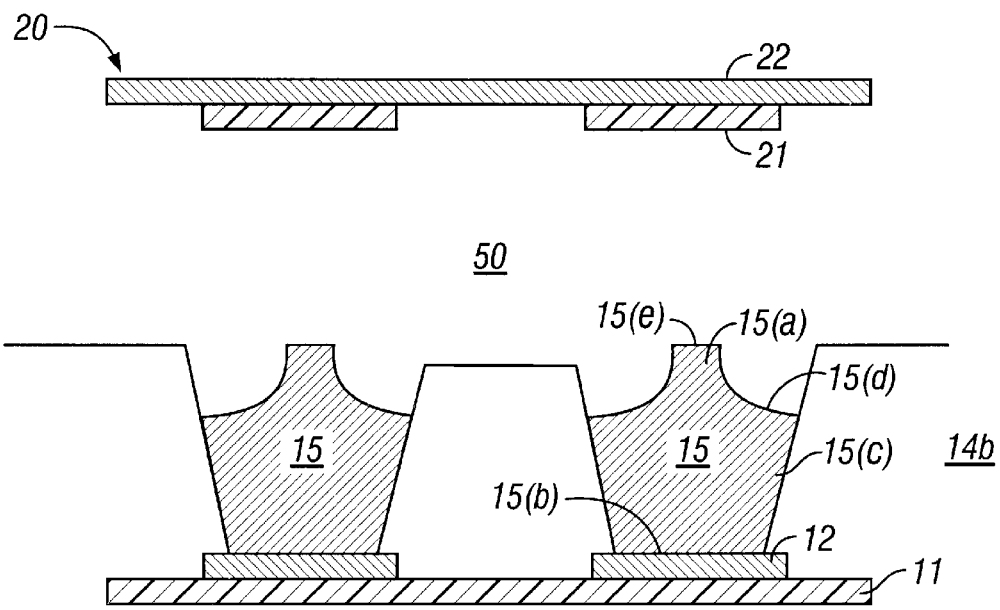

As shown in FIG. 3(b), at least part of the first end portion 15(a) of an elongated body 15 can extend above the upper surface of the photosensitive layer 14(b) used in the electrolytic etching process so that the first end portion 15(a) can be etched more effectively. For example, as shown in FIG. 3(b), an etching medium such as the electrolytic medium 50 can access the side surfaces of the first end portion 15(a) of the conductive bodies 15. Consequently, the side surfaces of the first end portion 15(a) can be more effectively etched. After etching, the sides of the first end portion 15(a) of the conductive body 15 can have a concave surface 15(d). After etching, the photosensitive layer 14(b) can be removed.

The conductive material at the first end portion of the conductive body can also be removed by chemical etching. In these embodiments, a masking material may be deposited on a portion of a substantially planar surface at the first end portion of the conductive body. When a chemical etchant contacts the first end portion of the conductive body, the conductive material under the masking material is not etched, while the conductive material surrounding the masking material is etched. Subsequently, the masking material is removed from the planar surface leaving a tapered first end portion.

Figure 4A:
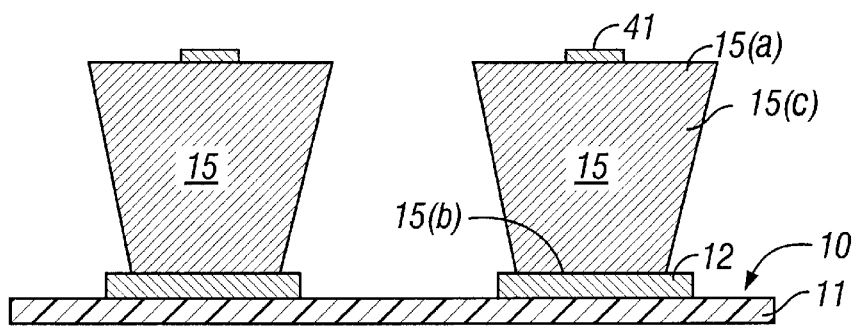
FIGS. 4(a)–4(b) show schematic cross-sections illustrating another process of fabricating a conductive body having a tapered end.
Figure 4B:
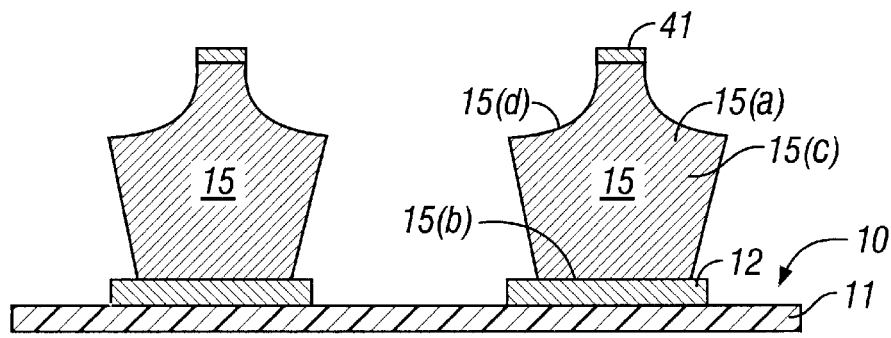

As shown in FIG. 4(a), for example, after removing the photosensitive layer used to form the conductive bodies 15, a masking material 41 may be deposited on a substantially planar surface of the first end portion 15(a). The masking material 41 may include any suitable material capable of protecting an underlying conductive material during etching. Examples of suitable masking materials include photoresists (e.g., positive or negative) or masks including epoxy-based masking materials. Preferably, the masking material 41 is deposited at or near the center of the substantially planar surface of the first end portion 15(a) of the conductive body 15. The masking material 41 may be deposited on a surface of the first end portion of a conductive body in any suitable manner. For example, the masking material 41 may be deposited by stenciling or with a dispenser such as a commercially available Westbond dispenser.

After the masking material is deposited, the conductive material around the masking material can be removed. For instance, the first end portions 15(a) of a conductive bodies 15 can be introduced to a chemical etchant such as ammonium persulfate. For example, the first end portion 15(a) of the conductive body 15 may be introduced to a chemical etchant by dipping or immersion. The chemical etchant removes conductive material from the sides of the first end portion 15(a) so that the first end portion is tapered. A photosensitive layer (not shown) may be disposed around the intermediate and second end portions 15(c), 15(b) of the conductive bodies 15 so that these portions can be protected from etching. After etching, the masking material can be removed.

Figure 5A:
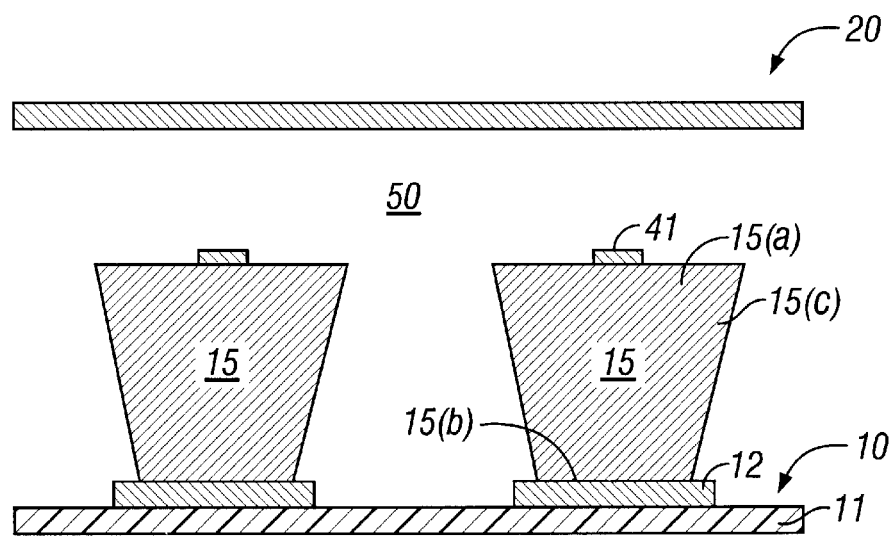
FIGS. 5(a)–5(b) show schematic cross-sections illustrating another process of fabricating a conductive body having a tapered end.

A masking material may also be used in conjunction with electrolytic etching. For example, as shown in FIG. 5(a), a cathode element 20 can be disposed generally parallel to the circuitized layer 10 including a dielectric layer 11 and conductive regions 12. Conductive bodies 15 are disposed on the conductive regions 12 and are generally perpendicular thereto. A masking material 41 can be deposited on a planar surface at the first end portion 15(a) of the conductive body 15. An electrolytic medium 50 is present between the cathode element 20 and the circuitized layer 10.

Figure 5B:
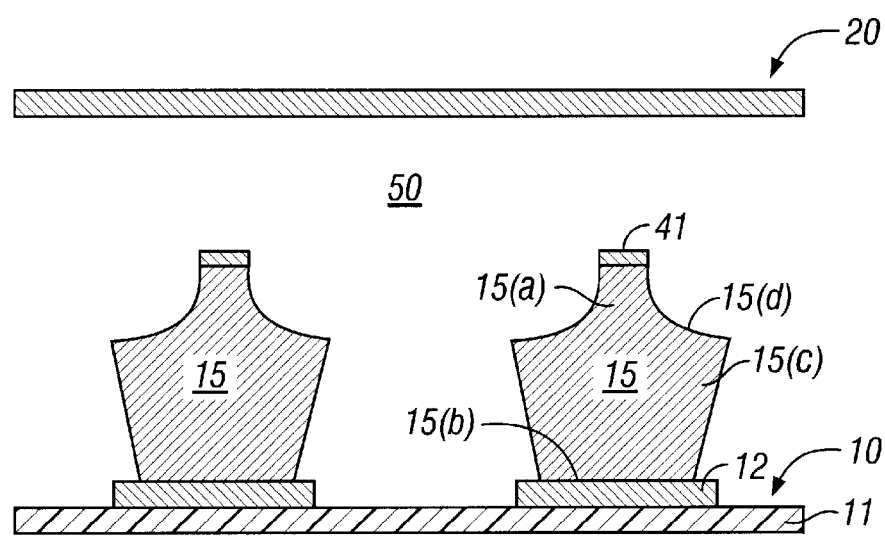

Electrolytic etching can proceed in a manner similar to the embodiments described with reference to FIGS. 2(a) and 2(b). However, unlike the electrolytic etching embodiment described with reference to FIGS. 2(a) and 2(b), the cathode element 20 in the arrangement shown in FIGS. 5(a) and 5(b) does not include a cover layer. As shown in FIG. 5(b), the masking material 41 disposed on the conductive bodies prevents the conductive material under the masking material 41 from being electrolytically etched so that a tapered first end portion 15(a) is formed.

The geometry of the tapered structure (e.g., the sharpness of the taper) can be selectively modified by varying any suitable process parameter. For example, parameters which can be varied in electrolytic etching include the magnitude of the current at preselected regions of the cathode element, the distance between the cathode element and the conductive bodies to be etched, the geometry of the exposed conductive portions of the cathode element, the etching time, the current density, and the amount of agitation in the electrolytic medium. Parameters which can be varied in an chemical etching process include the etchant concentration, the etch time and temperature, and the agitation of the etchant.

The terms and expressions which have been employed herein are used as terms of description and not of limitation, and various modifications to the described embodiments are within the scope of the claimed invention. For example, although interconnections between chips and circuitized layers have been discussed in detail for illustration purposes, embodiments of the invention can also be used to form z-connections in multilayer circuit substrates. Moreover, any one or more features of any embodiment of the invention may be combined with any one or more other features of any other embodiment of the invention, without departing from the scope of the invention.

What is claimed is:

1. A conductive post comprising:
   a tapered first end portion having a first substantially planar surface and a concave surface adjacent to the first substantially planar surface;
   a second end portion including a second substantially planar surface, wherein the second substantially planar surface has a larger area than the first substantially planar surface; and
   an intermediate portion disposed between the first end portion and the second end portion, said intermediate portion comprises a horizontal cross-sectional area which increases from said second end portion in a vertical axial direction.

2. The conductive post of claim 1, wherein the conductive post has a length of about 40 microns or more.

3. The conductive post of claim 1, wherein the concave surface surrounds the first substantially planar surface.

4. The conductive post of claim 1, wherein the conductive post has an aspect ratio of about 4:1 or more.

5. The conductive post of claim 1 wherein the cross-sectional area of the intermediate portion and the cross-sectional area of the second end portion are substantially the same.

6. The conductive post of claim 1 wherein the conductive post comprises copper.

7. The conductive post of claim 1 wherein said concave surface terminates in said first substantially planar surface and comprises a uniform downwardly sloping concave surface.

8. The conductive post of claim 7 wherein said intermediate portion comprises a horizontal cross-sectional area which increases from said second end portion in a vertical axial direction.

9. The conductive post of claim 8 wherein said, intermediate portion comprises an exterior wall outwardly diverging from said second end portion.

10. The conductive post of claim 1 wherein said intermediate portion comprises an exterior wall outwardly diverging from said second end portion.

11. An electrically conductive article comprising:
    a conductive post having
    a tapered first end portion having a first substantially planar surface and a concave surface adjacent to the first substantially planar surface, said concave surface terminates in said first substantially planar surface and comprises a uniform downwardly sloping concave surface commencing from said first substantially planar surface;
    a second end portion including a second substantially planar surface, wherein the second substantially planar surface has a larger area than the first substantially planar surface;
    an intermediate portion disposed between the first end portion and the second end portion;
    a dielectric layer;
    a conductive region on the dielectric layer; and
    the conductive post coupled to the conductive region, wherein the second end portion of the post is proximate to the conductive region and the tapered first end portion is distal to the conductive region.

12. The electrically conductive article of claim 11 further comprising a solder body disposed around the tapered first end portion of the conductive post.

13. The electrically conductive article of claim 11 wherein said intermediate portion comprises a horizontal cross-sectional area which increases from said second end portion in a vertical axial direction.

14. The electrically conductive article of claim 13 wherein said intermediate portion comprises an exterior wall outwardly diverging from said second end portion.

15. An electrically conductive article comprising:
    a conductive post having
    a tapered first end portion having a first substantially planar surface and a concave surface adjacent to the first substantially planar surface;
    a second end portion including a second substantially planar surface, wherein the second substantially planar surface has a larger area than the first substantially planar surface;
    an intermediate portion disposed between the first end portion and the second end portion, said intermediate portion comprises a horizontal cross-sectional area which increases from said second end portion in a vertical axial direction;
    a dielectric layer;
    a conductive region on the dielectric layer; and
    the conductive post coupled to the conductive region, wherein the second end portion of the post is proximate to the conductive region and the tapered first end portion is distal to the conductive region.

16. The electrically conductive article of claim 15 wherein said intermediate portion comprises an exterior wall outwardly diverging from said second end portion.

* * * * *